US008818754B2

(12) United States Patent (10) Patent No.: US 8,818,754 B2
Kamenev et al. (45) Date of Patent: Aug. 26, 2014

(54) THIN FILMS AND SURFACE TOPOGRAPHY MEASUREMENT USING REDUCED LIBRARY

(75) Inventors: Boris V. Kamenev, Beaverton, OR (US); Michael J. Darwin, Portland, OR (US)

(73) Assignee: Nanometrics Incorporated, Milpitas, CA (US)

( * ) Notice: Subject to any disclaimer, the term of this patent is extended or adjusted under 35 U.S.C. 154(b) by 408 days.

(21) Appl. No.: 13/112,821

(22) Filed: May 20, 2011

(65) Prior Publication Data

US 2012/0271591 A1 Oct. 25, 2012

Related U.S. Application Data

(60) Provisional application No. 61/478,140, filed on Apr. 22, 2011.

(51) Int. Cl.
| | | |
|---|---|---|
| *G01B 3/22* | (2006.01) | |
| *G01B 5/20* | (2006.01) | |
| *G01B 7/28* | (2006.01) | |
| *G01B 11/24* | (2006.01) | |
| *G01B 13/16* | (2006.01) | |
| *G01B 15/04* | (2006.01) | |
| *G01B 17/06* | (2006.01) | |
| *G01B 21/20* | (2006.01) | |
| *G01B 9/02* | (2006.01) | |
| *G01B 11/06* | (2006.01) | |

(52) U.S. Cl.
CPC .......... *G01B 11/2441* (2013.01); *G01B 9/0209* (2013.01); *G01B 9/02084* (2013.01); *G01B 11/0675* (2013.01); *G01B 2290/45* (2013.01); *G01B 9/02072* (2013.01); *G01B 11/06* (2013.01)
USPC ........... 702/167; 356/511; 356/467; 356/503; 356/512

(58) Field of Classification Search
USPC .......................................................... 702/167
See application file for complete search history.

(56) References Cited

U.S. PATENT DOCUMENTS 5,398,113 A 3/1995 De Groot
5,912,165 A * 6/1999 Cabib et al. ................ 435/287.2
(Continued)

FOREIGN PATENT DOCUMENTS

WO WO 01/55669 A1 8/2001

OTHER PUBLICATIONS

International Search Report and Written Opinion mailed on Aug. 9, 2012 for PCT Application No. PCT/US2012/033622 filed on Apr. 13, 2012 by Nanometrics Incorporated, 12 pages (Continued)

*Primary Examiner* — Tung S Lau
*Assistant Examiner* — Stephanie Chang
(74) *Attorney, Agent, or Firm* — Silicon Valley Patent Group LLP

(57) ABSTRACT

The properties of a surface of an object in presence of thin transparent films are determined by generating a library of model signals and processing a measurement signal via searching the library to evaluate films properties and topography. The library may be reduced with principal component analysis to enhance computation speed. Computation enhancement may also be achieved by removal of the height contributions from the signal leaving only the film contribution in the signal. The film measurement signal is compared to a library of film signals to determine the film parameters of the sample. The library of film signals is produced by processing each full signal in a library to similarly remove the height contributions leaving only the film contributions. Additionally, a post-analysis process may be applied to properly evaluate local topography.

17 Claims, 9 Drawing Sheets

(56) References Cited

U.S. PATENT DOCUMENTS

| | | | |
|---|---|---|---|
| 6,545,763 B1 | 4/2003 | Kim et al. | |
| 7,061,623 B2 | 6/2006 | Davidson | |
| 7,324,214 B2* | 1/2008 | De Groot et al. | 356/511 |
| 7,403,805 B2* | 7/2008 | Abreu | 600/318 |
| 7,539,583 B2* | 5/2009 | Fu et al. | 702/81 |
| 7,684,049 B2* | 3/2010 | De Groot et al. | 356/511 |
| 7,945,393 B2* | 5/2011 | Treado et al. | 702/19 |
| 7,948,636 B2* | 5/2011 | De Groot et al. | 356/511 |
| 8,126,677 B2* | 2/2012 | De Groot et al. | 702/166 |
| 2003/0023170 A1* | 1/2003 | Gardner et al. | 600/476 |
| 2004/0024298 A1* | 2/2004 | Marshik-Geurts et al. | 600/326 |
| 2004/0181344 A1* | 9/2004 | Stephanopoulos et al. | 702/20 |
| 2005/0098264 A1* | 5/2005 | Wolf et al. | 156/345.32 |
| 2006/0020401 A1* | 1/2006 | Davis et al. | 702/30 |
| 2006/0176522 A1* | 8/2006 | Mansfield et al. | 358/474 |
| 2006/0181714 A1* | 8/2006 | Mater et al. | 356/512 |
| 2006/0199287 A1* | 9/2006 | Fu et al. | 438/16 |
| 2007/0046953 A1* | 3/2007 | De Groot et al. | 356/512 |
| 2007/0229807 A1 | 10/2007 | Lally et al. | |
| 2008/0266574 A1* | 10/2008 | Groot et al. | 356/511 |
| 2010/0265516 A1* | 10/2010 | De Groot et al. | 356/511 |
| 2011/0028807 A1* | 2/2011 | Abreu | 600/321 |

OTHER PUBLICATIONS

De Groot, Peter J. et al. (2008). "Transparent film profiling and analysis by interference microscopy" *Interferometry XIV: Applications, Proc. of SPIE*, vol. 7064: 1-6.

De Lega, Xavier C. et al. (2009). "Multi-purpose optical profiler for characterization of materials, film stacks, and for absolute topography measurement", *Proc. SPIE* 7272: 1-9.

* cited by examiner

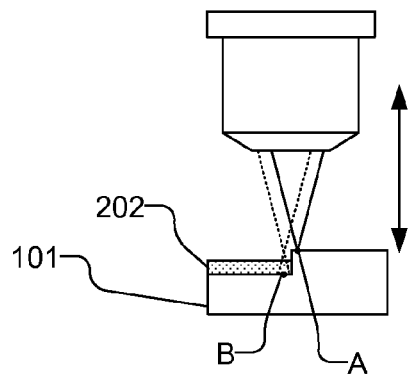
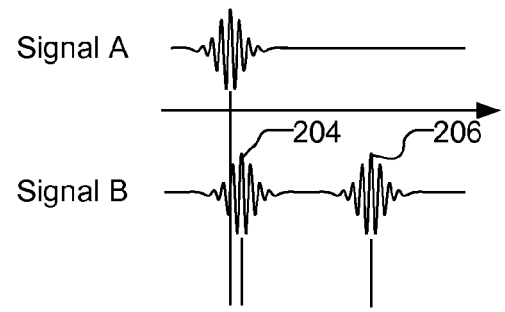
Fig. 4A          Fig. 4B
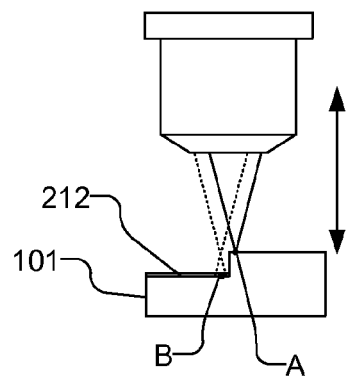
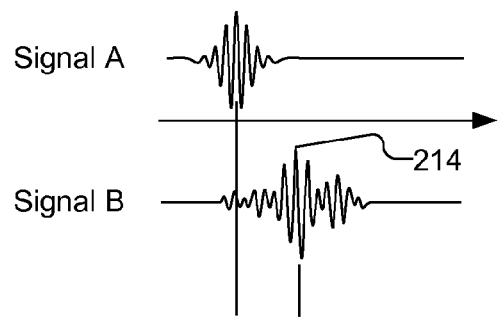
Fig. 5A          Fig. 5B

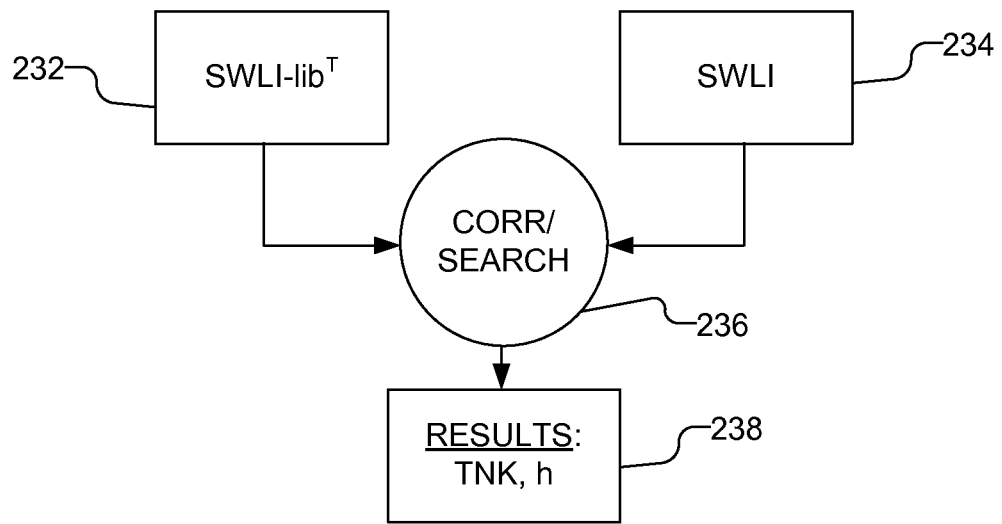
Fig. 6
(Conventional)

THIN FILMS AND SURFACE TOPOGRAPHY MEASUREMENT USING REDUCED LIBRARY

CROSS-REFERENCE TO PENDING PROVISIONAL APPLICATION

This application claims priority under 35 USC 119 to U.S. Provisional Application No. 61/478,140, filed Apr. 22, 2011, and entitled "Surface Height Measurement Using Reduced Library", which is incorporated herein by reference.

BACKGROUND

Interferometers are optical instruments used for measuring surface topographies to map variations in surface height with high accuracy. Many interferometer techniques, however, require a prior knowledge of material parameters and film thickness. Moreover, interferometers, such as Scanning White Light Interferometers, suffer from low computation speed due to the number of calculations that are required to reconstruct the sample surface. In particular, analytical approaches to surface reconstruction through the use of Fourier Domain Analysis require prefiltering of the signal, followed by Fourier analysis of each data point in the image plane. In many practical applications, the Fourier Domain Analysis approach is inherently erroneous due to an insufficient description of the thin films and/or dissimilar material properties within the measured region. Likewise, empirical approaches that perform correlation to library entries which can be used to describe local film properties, must also prefilter the signal and correlate to image plane data points. Both such traditional approaches to Scanning White Light Interferometer signal processing are numerically intensive and computationally inefficient. Accordingly, improvements are desired Another limitation of conventional techniques is the inability to efficiently measure local topography (e.g. roughness) in the presence of thin films. While a relative precise and accurate average thickness of the analyzed area may be determined with, for instance, a library search, errors in thickness for individual small areas (single data point such as a pixel in a light detector) will translate to an amplified height error in the local topography. The amplification coefficient depends on film properties (e.g. T, N&K) and can be an order of magnitude of the thickness error. The thickness error of individual data point is due to measurement system noise and traditionally requires signal averaging to reduce the noise contribution. Signal averaging, however, suffers from long measurement time preventing efficient usage, strict requirements on measurement system stability (as long measurement time is required) and low efficiency of noise suppression (as square root of N—number of averages). The improvement is, therefore, desired.

SUMMARY

To address low computation speed of, e.g., traditional Scanning White Light Interference (SWLI), signal processing, a technique that addresses thin film optical properties while efficiently processing measured signal in the field of view may be used. In one embodiment, a model based approach may be used to cover film properties variation and may use utilizes principal component analysis. In another embodiment, the measurement signal is separated signal into its nominal contributions of distance (or height) and film properties. To accurately analyze the impact of films properties on the measurement signal, a "films" library of topographically flat signals may be constructed using a description of the local film stack, which includes both a range of optical properties of the films as well as a range of film thickness. A theoretical measurement signal can be reconstructed by combining a specific set of film properties with some nominal distance/step height and a signal library may be generated that covers nominal variations of height and film properties. To efficiently search the library, both the measured signal and the library entries may be reduced to their principle components, thereby reducing the dimensionality of the search library by the ratio of raw data points to the number of principle components. Moreover, a "pre-search" of the library can be done by processing the measurement signal to remove the height contributions, leaving only the film contribution in the measurement signal, and comparing the film measurement signal to a film signal library, generated in a similar fashion. Principle components analysis may be applied for this comparison thus further enhancing computational efficiency. Once the film measurement signal is compared to the library of film signals to determine the film parameters of the sample, a reduced library of full signals is generated and compared to the original measurement signal to determine the height parameter of the sample.

To overcome limitations of local topography measurements, a post analysis process is applied. The process applies a corrective scaling factor to a film thickness map and uses the difference between the surface map and scaled thickness map as the correct topography. The scaling factor can be either extracted from library of model signals or by minimization of the surface map and scaled thickness map difference. The minimization can also be applied as reverse engineering technique for refining film properties results obtained as described above to address an idealization of measurement system with model signal library generation.

BRIEF DESCRIPTION OF THE DRAWINGS

FIGS. 4A and 4B are similar to FIGS. 3A and 3B where a relatively thick film is present on the sample.

FIGS. 5A and 5B are similar to FIGS. 3A and 3B where a relatively thin film is present on the sample, illustrating coalesce of two separate signals in the resulting white light interference pattern.

FIG. 6 illustrates a conventional self-consistent model based technique for extracting corrected topography and/or film properties, where a self-consistent model does not require independent evaluation of film properties.

DETAILED DESCRIPTION

Figure 1:
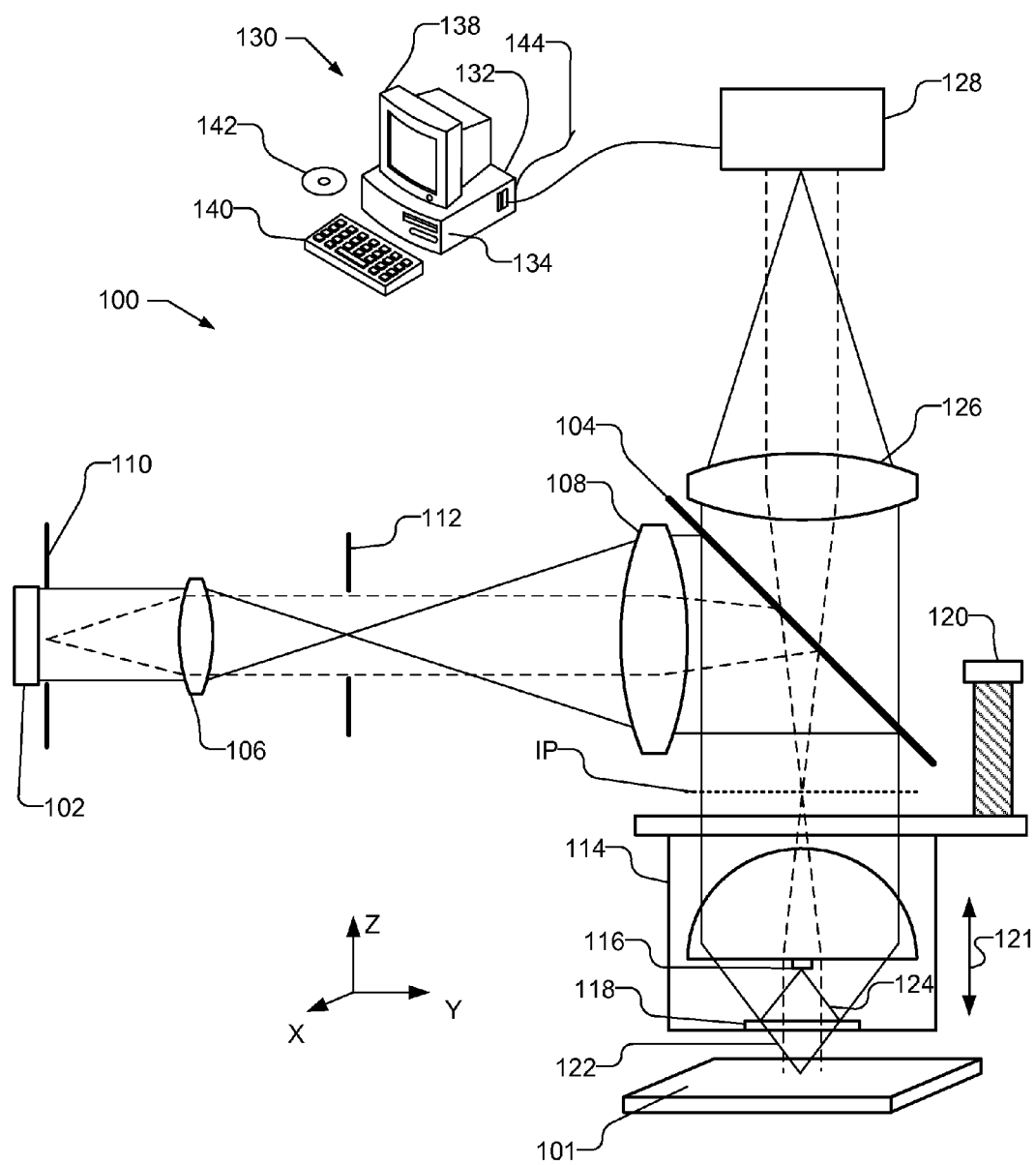
FIG. 1 illustrates an interference metrology device that can be used to measure the topography of the surface of a sample that includes one or more thin films by separating the contributions from height and films in the detected measurement signals.

FIG. 1 illustrates an interference metrology device 100 that can be used to measure the topography of the surface of a sample that includes one or more thin films by separating the contributions from height and films in the detected measurement signals. The films contributions to the measurement signals are used to characterize the one or more films. Using the characterization of the one or more films, a reduced set of library signals can be retrieved for comparison to the full measurement signal, thereby allowing determination of the topography, as well as the film parameters using a library that is greatly reduced in size relative to a conventional system.

The interference metrology device 100 illustrated in FIG. 1 is a Scanning White Light Interferometer (SWLI). Metrology device includes a broadband light source 102 and a beam splitter 104 with one or more lenses 106, 108, and aperture stop 110 and field stop 112 disposed between. Light from the beam splitter 104 is reflected towards an interference objective 114, which includes a reference mirror 116 and interferometer beam splitter 118. The interference objective 114 is coupled to an actuator 120, which is controlled by computer 150, to adjust the vertical position of the interference objective 114, as illustrated by arrow 121. The interference objective 114 produces a sample beam 122 that is incident on the sample 101 as an illumination spot and reflects from the sample 101, as well as a reference beam 124 that is reflected by the interferometer beam splitter 118 and reference minor 116. The reference beam 124 is combined with the sample beam 122 after the sample beam is reflected by the sample 101 and passes back through the interferometer beam splitter 118. After passing through the interference objective 114, the combined beam passes through the beam splitter 104 and is focuses by an imaging lens 126 onto a camera 128, which is coupled to the computer 130.

The computer 130 may also be coupled to control the actuator 120 as well as a stage to move sample 101. The computer 130 may a processor 132 with memory 134, as well as a user interface including e.g., a display 138 and input devices 140. A computer-usable medium 142 having computer-readable program code embodied may be used by the computer 130 for causing the processor to control the metrology device 100 and to perform the functions including the analysis described herein. The data structures and software code for automatically implementing one or more acts described in this detailed description can be implemented by one of ordinary skill in the art in light of the present disclosure and stored, e.g., on a computer readable storage medium 142, which may be any device or medium that can store code and/or data for use by a computer system such as processor 132. The computer-usable medium 142 may be, but is not limited to, magnetic and optical storage devices such as disk drives, magnetic tape, compact discs, and DVDs (digital versatile discs or digital video discs). A communication port 144 may also be used to receive instructions that are used to program the computer 130 to perform any one or more of the functions described herein and may represent any type of communication connection, such as to the internet or any other computer network. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

Figure 2A:
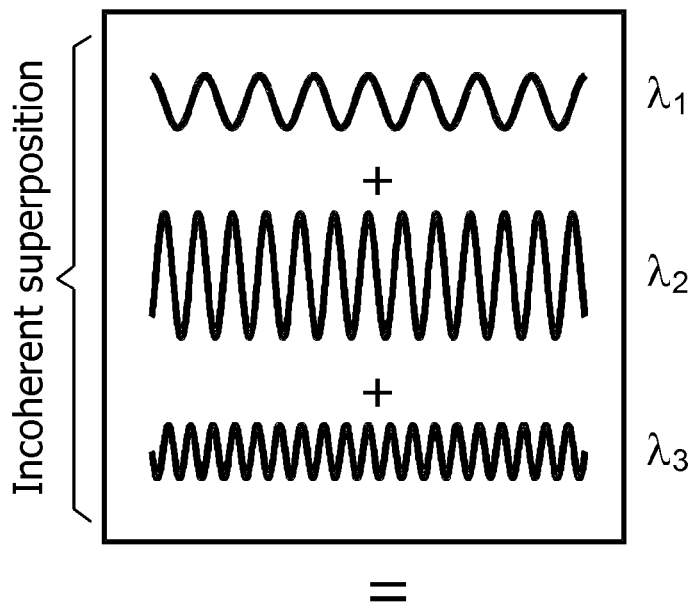
FIGS. 2A and 2B illustrate the incoherent superposition of multiple wavelength interference patterns of white light.
Figure 2B:
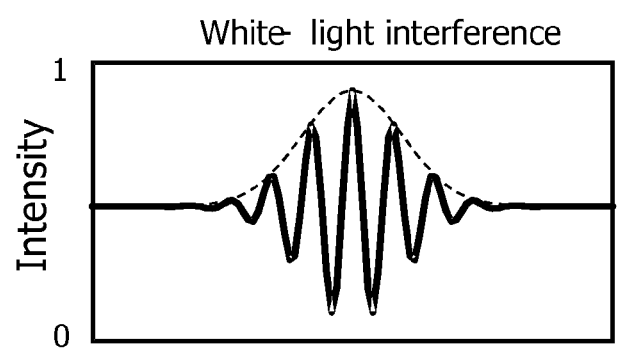

In operation, the metrology device 100 scans the interference objective 114, as indicated by the arrow 121 collecting interference patterns in the image plane (IP). White light interference is the incoherent superposition of multiple wavelength interference patterns, as illustrated in FIGS. 2A and 2B. FIG. 2B illustrates the measured intensity of three wavelengths $\lambda_1$, $\lambda_2$, and $\lambda_3$ of light, the incoherent superposition of which is illustrated in FIG. 2A, at a single pixel in camera 128, where the vertical axis represents intensity and the horizontal axis represents the Z position (i.e., height) of the interference objective 114 from the surface of the sample 101. By summing the intensities of the wavelengths, a white light interference pattern is produced, as illustrated in FIG. 2B, where again the vertical axis represents intensity and the horizontal axis represents the Z position (i.e., height) of the interference objective 114 from the surface of the sample 101. When the peaks for the wavelengths are equal and all patterns have a common phase, i.e., at the peak of the curve white light interference pattern, illustrated in FIG. 2B, the surface of sample 101 is detected (L=0).

Figure 3A:
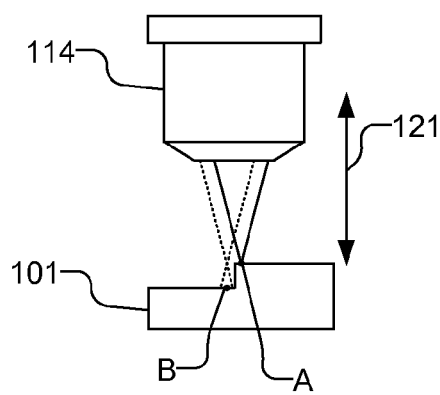
FIG. 3A illustrates an interference objective producing two beamlets within an illumination spot on a sample and FIG. 3B illustrates the white light interference patterns produced by the beamlets.
Figure 3B:
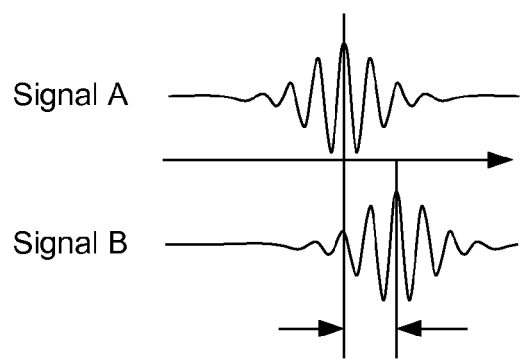

FIG. 3A illustrates the interference objective 114 producing two beamlets A and B within the illumination spot on the sample 101, i.e., beamlets A and B represent portions of the sample beam 122 that are focused on different pixels in the camera 128. White light interference patterns for multiple locations in the illumination spot, as illustrated by beamlets A and B in FIG. 3A, may be produced by detecting intensity signals for different pixels in camera 128 at different Z positions as illustrated by arrow 121. FIG. 3B illustrates the white light interference patterns produced by beamlets A and B. By comparing the peaks of the white light interference patterns, as illustrated in FIG. 3B, the relative height difference between multiple locations can be determined. The interference objective 114 may be scanned parallel to the surface of the sample 101 while detecting the relative height differences to map the topography of the surface of the sample 101 as a three-dimensional image. White light interferometer metrology device 100 and its general operation is described in more detail in U.S. Pat. Nos. 5,398,113, 6,545,763 and 7,061,623 as well as in "Peter J. de Groot and Xavier Colonna de Lega in "Transparent film profiling and analysis by interference microscopy" Interferometry XIV: Applications, Proc. Of SPIE, Vol. 7064 (2008), all of which are incorporated herein by reference.

While a scanning white light interferometer is generally described herein, it should be understood that other types of metrology devices that can characterize the surface height and film thickness variation may be used herein, including an interferometer confocal microscope.

Unfortunately, the interference patterns generated by interferometer devices, such as SWLI described above are sensitive to surface composition. Different material layers at different locations in the illumination spot may affect the resulting interference patterns. For example, as illustrated in FIG. 4A, when a thick layer (e.g., greater than 1 μm) of material 202 is present at one location on the sample 101, the resulting white light interference pattern produces two separate signal peaks 204 and 206 in FIG. 4B. Where, however, a thin layer of material 212 is present at one location on the sample 101, as illustrated in FIG. 5A, the two separate signals in the resulting white light interference pattern may coalesce, thereby altering the position of the peak 214, as illustrated in FIG. 5B, which will affect the height difference measurement.

Conventional techniques for correcting step height errors caused by the presence of thin films, such as that described in X. C. de Lega et al., "Multi-purpose optical profiler for characterization of materials, film stacks, and for absolute topography measurement", Proc. SPIE 7272, 72723Z (2009), include using test and reference areas of the sample, measuring uncorrected step heights between the test and reference areas, evaluating the film properties of the test and reference areas using an independent metrology measurement, such as ellipsometry, modeling signals to compute a correction to be applied to the uncorrected step height and computing the corrected step height as the sum of the uncorrected step height and the step height correction. This technique, however, suffers from, among other problems, inconsistency (e.g. different measurements are required to evaluate film properties and topography), systematic errors, and lack of tool matching caused by idealization of the measurement system.

FIG. 6 illustrates a conventional self-consistent model based technique for extracting corrected topography and/or film properties, where a self-consistent model does not require independent evaluation of film properties. A library (SWLI-lib$^T$ 232) of topographically flat theoretical SWLI signals is created to cover the variation range of films parameters. A SWLI signal (SWLI 234) is generated from the sample under test. Each pixel in the signal SWLI 234 is correlated 236 to an entry in the library SWLI-lib$^T$ 232. The obtained correlation product for each pixel is further analyzed for the best match to library entry to obtain the results 238, including film properties thickness (T) and optical properties (N, K), and height h. Thus, the signal is compared/correlated to each library entry to find how the signals match to the library entry and to determine what is the signal displacement with respect to the library entry, as described by Peter J. de Groot and Xavier Colonna de Lega in "Transparent film profiling and analysis by interference microscopy" Interferometry XIV: Applications, Proc. Of SPIE, Vol. 7064 (2008), which is incorporated herein by reference.

Figure 7:
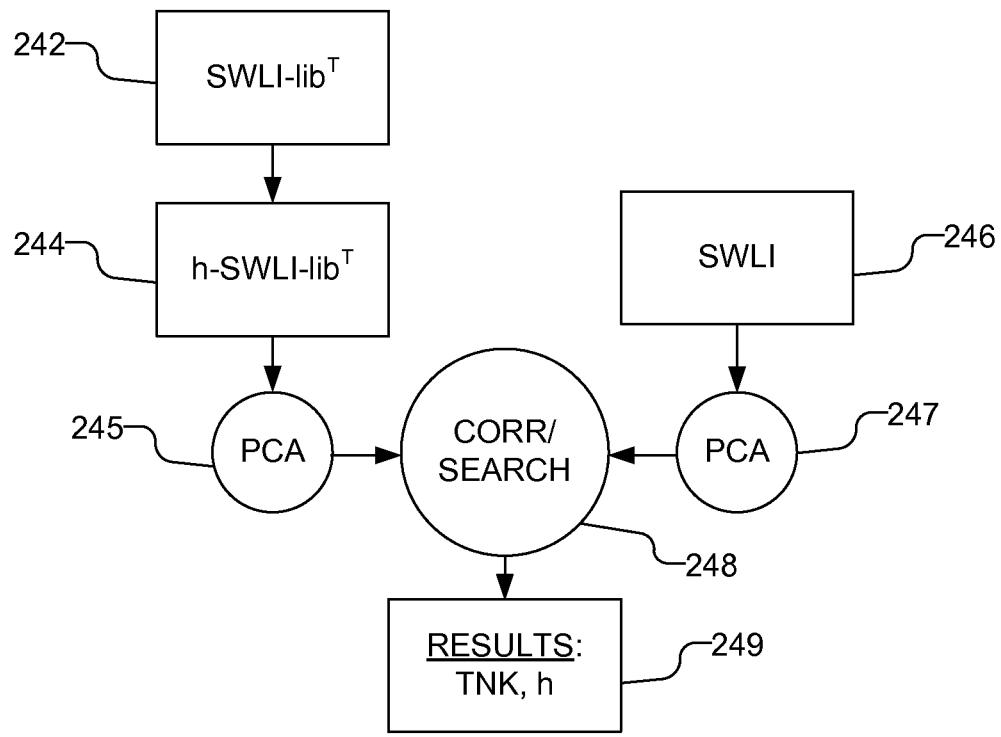
FIG. 7 illustrates a model based technique based on time domain according to an embodiment of the present invention.

FIG. 7 illustrates a model based technique based on time domain according to an embodiment of the present invention. A library (SWLI-lib$^T$ 242) of topographically flat theoretical SWLI signals is created to cover the variation range of film parameters. The library SWLI-lib$^T$ 242 is height skewed to capture signal variations due to different heights producing a height library h-SWLI-lib$^T$ 244 of SWLI signals in the time domain, i.e., height library h-SWLI-lib$^T$ 244 is a set of SWLI-lib$^T$ libraries created with different heights. Principal component analysis (PCA) (245) is applied to the height library h-SWLI-lib$^T$ 244 reducing the size of the signal. The obtained PCA transform 247 is applied to a signal SWLI 246 measured from the sample under test. The PCA reduced measured signal 246 are searched 248 over the PCA reduced height library h-SWLI-lib$^T$ PCA 245 to determine the results 249.

Figure 8:
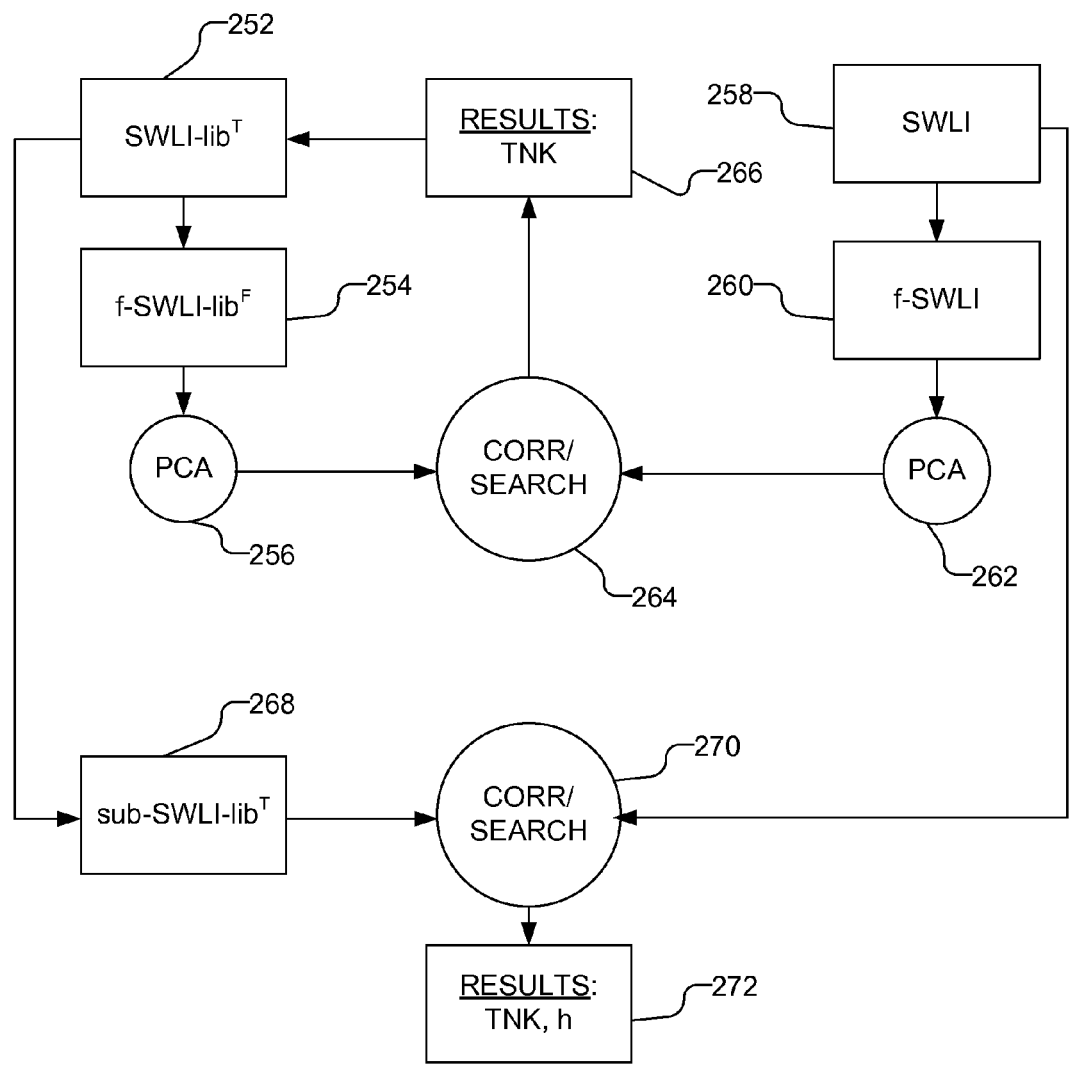
FIG. 8 illustrates a model based technique with a pre-search in the frequency domain in accordance with another embodiment of the present invention.

Additionally, by processing the measurement SWLI signal, the contribution from the step height can be removed from the measurement SWLI signal, thus, leaving only the contribution from the film properties in the measurement signal. FIG. 8 describes a model based technique with a pre-search in the frequency domain in accordance with another embodiment of the present invention. A library (SWLI-lib$^T$ 252) of topographically flat theoretical SWLI signals is created to cover the variation range of film parameters. The height dependent component of the library 252 is then removed by converting the SWLI-lib$^T$ library 252 to the frequency domain and performing spectral product computation to generate a frequency domain library (f-SWLI-lib$^F$ 254) of SWLI signals, which includes only components in the frequency domain and no height information. PCA 256 is applied to the frequency domain library f-SWLI-lib$^F$ 254 reducing the entry size. The measured SWLI signal 258 is subjected to the same process of converting the SWLI signal 258 to the frequency domain and performing spectral product computation to generate a frequency domain signal f-SWLI 260. The frequency domain signal f-SWLI 260 is reduced using the same PCA transform 262. The resulting PCA reduced frequency domain signal f-SWLI 260 is search 264 over the PCA reduced frequency domain library f-SWLI-lib$^F$ 254 to determine initial results 266 of film properties only, i.e., T, N, and K. The resulting films properties are supplied to the SWLI-lib$^T$ library 252 to define a sub-library sub-SWLI-lib$^T$ 268 of topographically flat theoretical SWLI signals in the time domain and with the same height. The size of the sub-SWLI-lib$^T$ library 268 can be as small as one entry. Finally, correlation 270 is performed for the measured signal SWLI 258 on each entry in the sub-library sub-SWLI-lib$^T$ 268 to produce results 272 including the height and/or refined film properties.

The process that includes a pre-search in the frequency domain, as described in FIG. 8, uses a lower dimensionality library (height/films libraries always have +1 dimension height) than the process described in FIG. 7. The number of computations increases with an increase in library size and thus the process of FIG. 8 has advantages with respect to the process described in FIG. 7. If desired, however, the processes described in FIGS. 7 and 8 may be combined.

Figure 9:
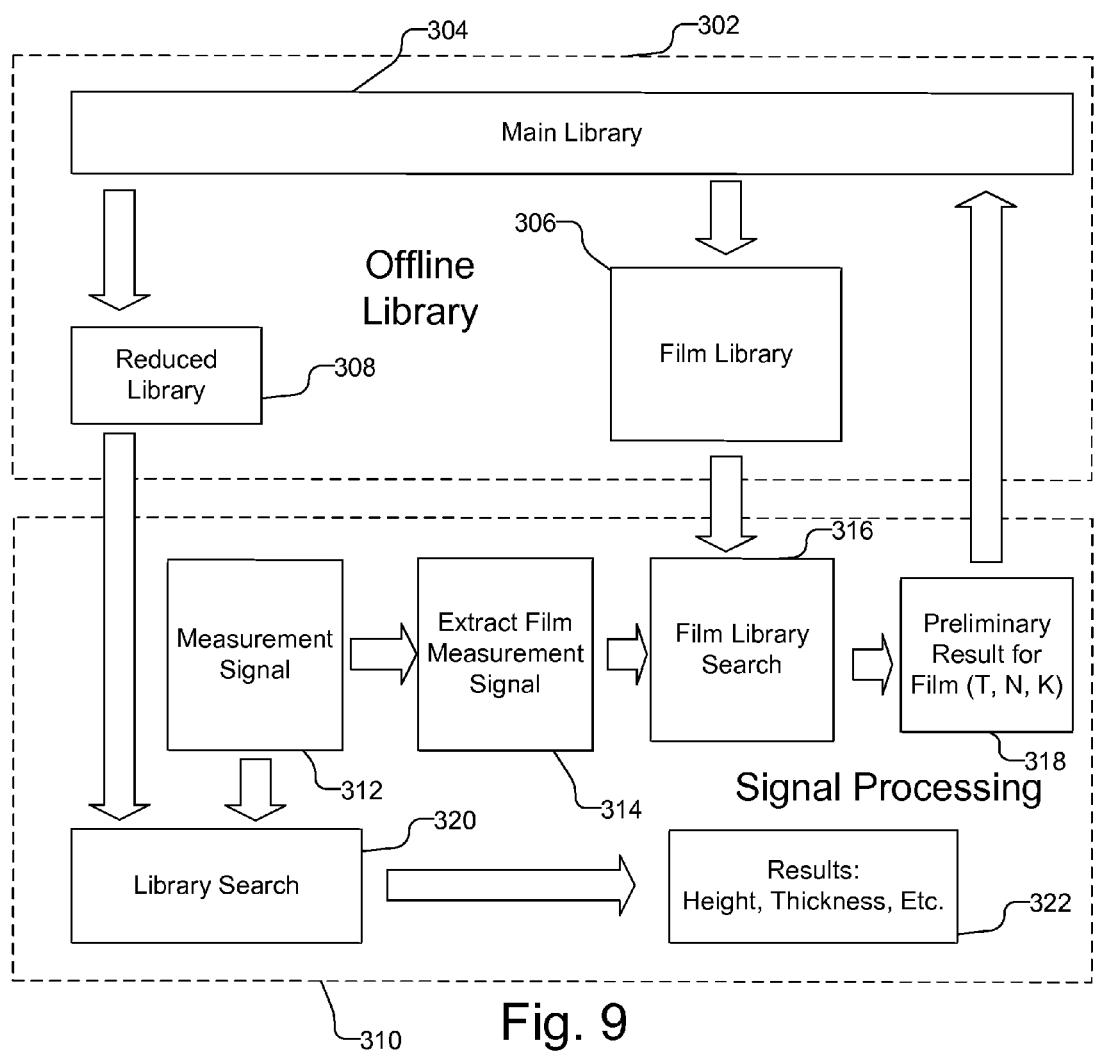
FIG. 9 illustrates an overview 300 of producing a corrected topography measurement using an interference metrology device by removing the height contribution.

FIG. 9 illustrates an overview 300 of producing a corrected topography measurement using an interference metrology device, such as that illustrated in FIG. 1 or other interference metrology device, by removing the height contribution, as described in FIG. 8. As illustrated, an offline library 302 is produced. The offline library 302 includes a main library 304 that includes a plurality of full signals, i.e., signals that include both the height and film contributions to the signals. The main library 304 of full signals may be generated empirically or theoretically. For example, the library 304 of full signals may be generated by mathematically generating system response signals for a range of parameters covering a process variation, such as thickness T of the film. For example, a number of signals for the measurement system are generated for a film thickness that ranges from 0 to 1 μm, in 0.05 μm increments, or smaller increments to provide additional accuracy. Other variable parameters of the film, such as N and K may be varied as well if desired.

The offline library 302 also includes a film library 306. The film library 306 is generated by removing the height contribution from the full signals in the main library 304. The signal in the frequency domain can be represented on the complex plane as:

$$S = Re + Im \quad \text{eq. 1}$$

Switching to polar coordinates, the real Re and imaginary Im parts of the signal can be written as follow:

$$Re = R \cdot \cos(\phi)$$

$$Im = R \cdot \sin(\phi) \quad \text{eq. 2}$$

Where R and φ are the radius and angle on the complex plane. The variation in the signal due to the film is captured in both R and φ. However, the variation in the signal due to different height is captured only in φ. Accordingly, the signal variation due to different height can be eliminated by processing the power spectra S as follows:

$$S^2 = Re^2 + Im^2 = R^2(\cos^2(\phi) + \sin^2(\phi)) = R^2 \qquad \text{eq. 3}$$

As illustrated in the signal processing 310, the measurement signal from the sample is obtained 312 using an interferometer device, such as that illustrated in FIG. 1, or other appropriate device. The signal processing then extracts the film measurement signal 314 as per equation 3. A search 316 of the film library 306 is then performed using the extracted film measurement signal to produce a preliminary result 318 for the film parameters, e.g., thickness, N and K.

The film parameter results 318 are then used to reduce the size of the main library 304 to produce a reduced library 308. The reduced library 308 includes full signals, i.e., that include both the height and film components, but only those signals associated with the film parameters results 318. The film parameter results 318 are generally reliable, so the reduced library 308 may be composed with as single entry for simple step height evaluation. If desired, however, the variations in the film properties can be included in the reduced library 308 for more accurate results or if local topography measurements is of interest. Thus, the size and/or dimensionality of the reduced library 308 may be determined on a case by case basis as desired.

A reduced library search 320 is then performed using the obtained full measurement signal 312 to obtain the final results 322, including the height, as well as the film parameters, such as thickness, N and K.

Figure 10:
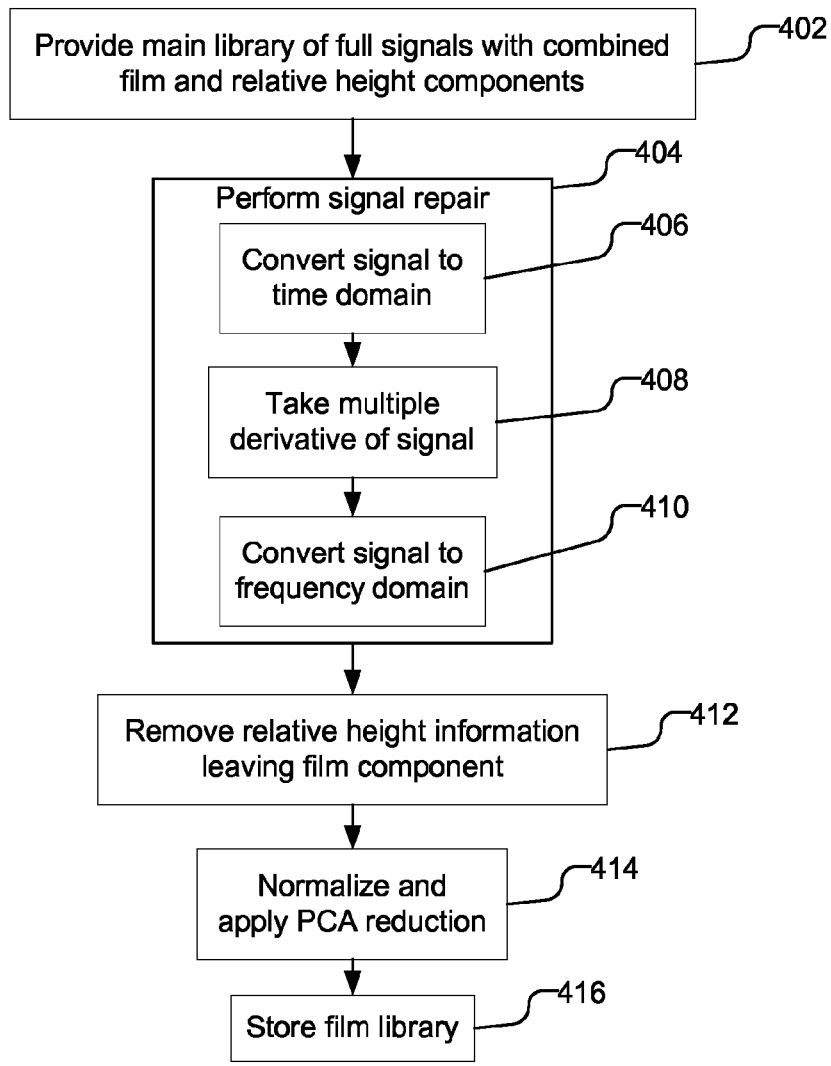
FIG. 10 illustrates a process of generating a library of film signals based on a library of full signals.

FIG. 10 illustrates a process of generating a library of film signals based on a library of full signals. As illustrated, a main library of full signals is provided (402). The full signals include both the film and relative height components. The main library may be produced empirically or theoretically. Signal repair is performed (404) on each full signal. For example, signal repair may include converting the signal to the time domain (406), e.g., by applying a Fast Fourier Transform (FFT). A second or higher derivative of the signal is generated (408) and the signal is reconverted back to the frequency domain (410), e.g., again by applying a FFT. If desired, other methods of signal repair may be applied.

The relative height information is removed from the full signal (412) leaving only the film component in the signal, which may now be referred to as a film signal. As discussed above, the film effect and relative height information in the full signal may be separated by computing the power spectrum, as shown in equation 3.

The film signal is then normalized (414) and the film signal is stored in memory as the film library (416). Additionally, if desired, the signal size may be reduced using principal component analysis (PCA) (414). Through PCA techniques, the signal size may be reduced down to 1 to 3 data points, as opposed to e.g., 200 points.

Figures 11A, 11B:
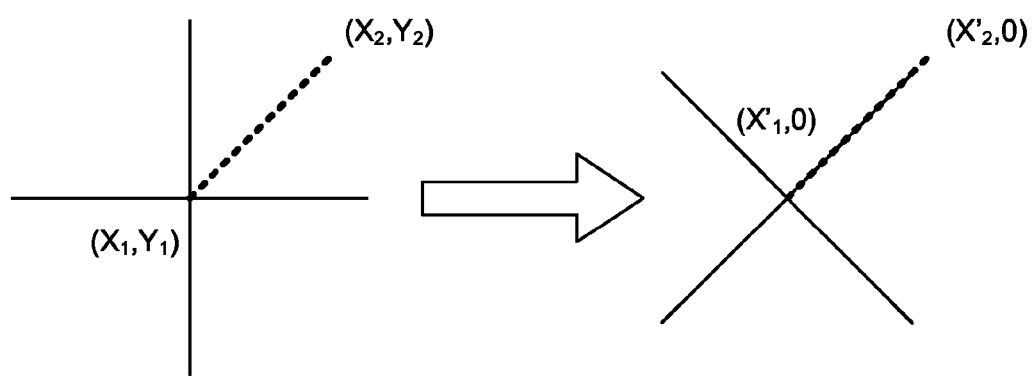
FIGS. 11A and 11B show how the transformation of a coordinate system can simplify the description of an objection.

As an illustration of PCA techniques, FIGS. 11A and 11B show how the transformation of a coordinate system can simplify the description of an objection. For example, an object $(X_2, Y_2)$ in an $(X_1, Y_1)$ coordinate system shown in FIG. 11A, is transformed into $(X'_2, 0)$ in the transformed coordinate system $(X'_1, 0)$ shown in FIG. 11B. In other words, the number of variable vector coordinates can be reduced by transforming the coordinate system. Similarly, an N-dimensional object can be simplified. Each signal in the library can be considered an N-dimensional vector, and the library can be represented by a matrix, where N is the size of the vector (i.e., the number of signal data points) and M is the number of library entries as follows:

$$\begin{pmatrix} X_0^0 & X_0^1 & \ldots & X_0^M \\ X_1^0 & X_1^1 & \ldots & X_1^M \\ \vdots & \vdots & \vdots & \vdots \\ X_N^0 & X_N^1 & \ldots & X_N^M \end{pmatrix} \qquad \text{eq. 4}$$

PCA involves any linear or non-linear transformation that transforms data to a new coordinate system such that the greatest variance by any projection of the data comes to lie on the first coordinate (called the first principal component), the second greatest variance on the second coordinate, and so on. Any PCA computation algorithms can be applied resulting in the set of transform vectors (eigenvectors) and the set of principal components (eigenvalues corresponding to the eigenvectors). The principal components are arranged by greater variance, and thus, the size of the vector, i.e., the signal size, can be reduced significantly, e.g., it has been found that 1-3 first components hold >99.99% percents of the signal information. Thus, applying the corresponding coordinate transforms to the library of signals results in a reduced library size which can be easily searched without heavy computations.

Figure 12:
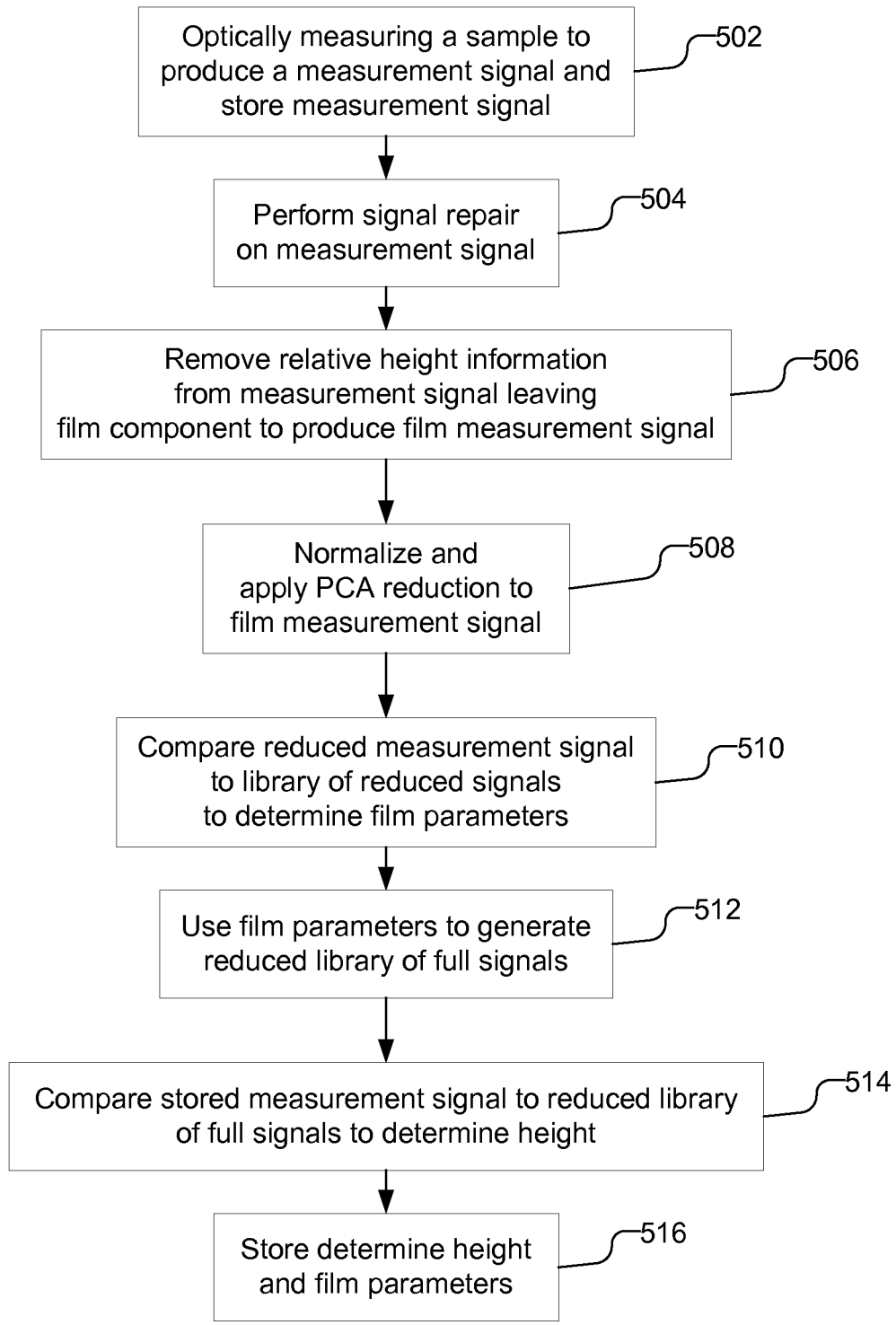
FIG. 12 illustrates a process of measurement of a sample by removing the height contribution from the measured signal.

FIG. 12 illustrates a process of measurement of a sample by removing the height contribution from the measured signal, e.g., data processing 310 in FIG. 9. As illustrated, the sample is optically measured to produce a measurement signal, which is stored in memory (502). Signal repair is performed on the measurement signal (504) in the same manner as described in 404 in FIG. 10. The relative height information is removed from the measurement signal (506) leaving only the film component in the measurement signal, which may now be referred to as a film measurement signal. As discussed above, the film effect and relative height information in the full signal may be separated by computing the power spectrum, as shown in equation 3. The film measurement signal is then normalized, and PCA may be applied, if used with the film library, to reduce the size of the film measurement signal (508).

The film measurement signal is then compared to signals in the film library to determine the film parameters (510). As discussed above, with the use of a scanning white light interferometer metrology device, as described in FIG. 1, multiple regions in the illumination spot are individually analyzed, i.e., a separate measurement signal is produced for each pixel in the camera 128. Thus, a separate film measurement signal is generated for each pixel and accordingly, film parameters are accordingly, determined for each pixel. Thus, if desired a film parameter map of the illumination spot may be produced. Additionally, if desired, an average of the film parameters determined for the plurality of pixels may be produced. The average of the film parameters (if produced) is then used to generate a reduced library of full signals (512). The reduced library is produced by providing only the full signals that are associated with the averaged film parameters. Of course, if an average of the film parameters is not produced, a reduced library of full signals is generated separately for each pixel.

The stored measurement signal, i.e., the full measurement signal that includes both the height and film parameters, is then compared to the reduced library of full signals, thereby determining the height (514), which can then be stored along with the film parameters (516) and reported as the results, e.g., by displaying a height map of the sample.

Figure 13:
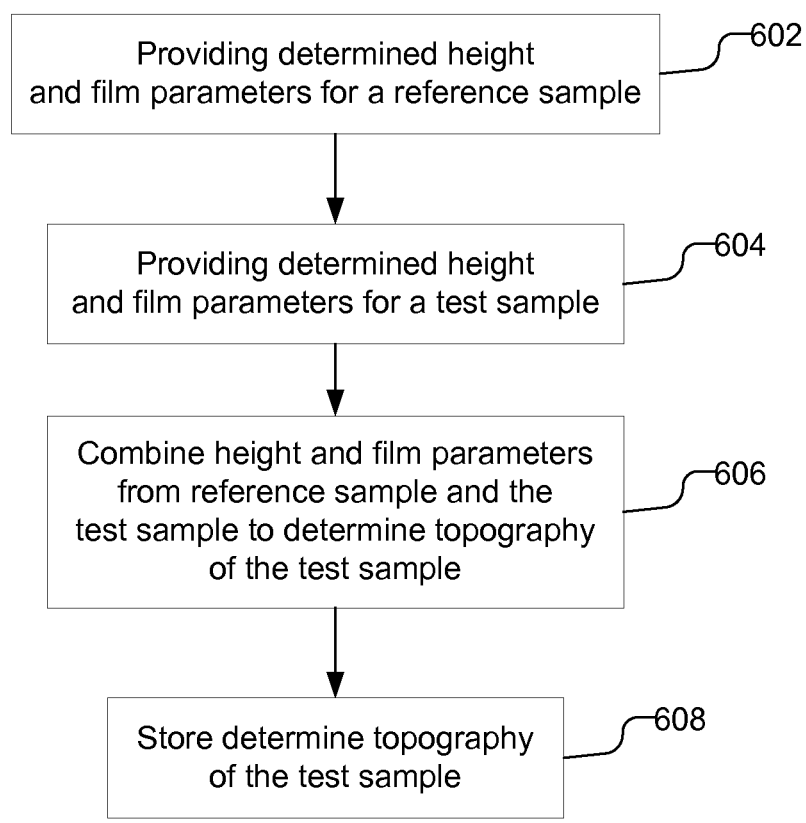
FIG. 13 illustrates providing the results of the measurement of the sample.

FIG. 13 illustrates providing the results of the measurement of the sample. As illustrated, the height and film parameters of a reference sample are provided, e.g., by interferometer measurement (602) as discussed above. The reference sample for example may be a flat unprocessed sample. The height and film parameters of the sample under test are also provided, as discussed above (604). The height and film parameters of the reference sample and the test sample are combined to determine the topography of the test sample (606), which is then stored (608) and reported as desired, e.g., by display.

Post analysis for local topography (e.g. roughness) and/or refining of the obtained topography and thickness maps is useful to address random fluctuations of the measurement system (such as light detector noise, vibrations, etc.). System noise randomly alters individual signals (pixels) resulting in film properties that are slightly different than true values, which is commonly known as measurement error. Index corrected topography, however, suffers from the following complication due to system noise. Generally, film proprieties are first evaluated and then the height is determined using the obtained film properties values. Errors in thickness values are amplified when translated into height. Depending on the film properties and thickness range, the amplification factor may be an order of magnitude. Thus, for example, if a certain pixel film thickness result deviates from the true value by +1 nm, the resulting height for the pixel may deviate from the true height by +/−10 nm. Accordingly, the topography map should be corrected to take into account this described error. The correction of the topography map is achieved by multiplying the thickness map by a scaling factor and subsequently subtracting the resulting thickness map from the topography map, on a pixel by pixel basis, e.g. each pixel of the thickness map is subtracted from corresponding pixels in the topography map.

The scaling factor may be determined using the library of model signals. For example, a correlation product of two neighbor library entries may be used to evaluate the height difference as a function of the difference in film parameters for the corresponding entries. Any other library analysis technique may also be applied. Considering the random nature of the system noise, the scaling factor may also be obtained by varying the scaling factor in order to find a minimum in statistical moment (variance or any other) of the subtraction result described above. The minimization technique may also be applied for refining of film properties. As the optimal scaling factor is found the refined film properties may be looked up from the library.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method of determining properties of a surface of an object, the method comprising:
   illuminating the surface of the object with an illumination source;
   detecting light reflected from the surface to produce a measurement signal;
   processing the measurement signal to remove a height contribution from the measurement signal leaving a film contribution in the measurement signal to produce a film measurement signal;
   comparing the film measurement signal to a plurality of film signals in a library to determine film parameters of the surface of the object, the library comprising the plurality of film signals and a plurality of full signals, wherein the plurality of film signals are associated with the plurality of full signals and the plurality of film signals are produced by removing height contributions from the plurality of full signals;
   generating a reduced set of full signals using the film parameters of the surface, the reduced set of full signals having fewer signals than the plurality of film signals;
   comparing the measurement signal to the reduced set of full signals to determine a height parameter of the surface of the object; and
   storing the height parameter and the film parameters.

2. The method of claim 1, wherein detecting light reflected from the surface to produce the measurement signal comprises detecting light on a two-dimensional detector optically aligned with the surface and having a plurality of pixels each corresponding to a respective location on the surface of the object, wherein each pixel produces the measurement signal, the method comprising processing the measurement signal for each pixel to produce the film measurement signal for each pixel; comparing the film measurement signal for each pixel to the plurality of film signals, generating the reduced set of full signals for each pixel, comparing the measurement signal for each signal to the reduced set of full signals to determine a height parameter for the pixel, and storing the height parameter and the film parameters for each pixel.

3. The method of claim 1, wherein processing the measurement signal to remove a height contribution from the measurement signal leaving the film contribution in the measurement signal to produce the film measurement signal comprises squaring the measurement signal in frequency domain.

4. The method of claim 1, further comprising applying principal component analysis (PCA) reduction to the film measurement signal, wherein each film signal in the plurality of film signals in the library are PCA reduced.

5. The method of claim 1, further comprising performing signal repair to the measurement signal prior to processing to produce the film measurement signal.

6. The method of claim 5, wherein performing signal repair comprises:
   converting the measurement signal to time domain;
   generating a multiple derivative of the measurement signal in time domain;
   converting a resulting derivative of the measurement signal to frequency domain as the measurement signal.

7. The method of claim 1, wherein illuminating the surface and detecting light is performed with a white light interferometer.

8. The method of claim 1, wherein illuminating the surface and detecting light is performed with a confocal microscope.

9. The method of claim 1, further comprising determining a local topography of the surface of the object comprising:
   obtaining a film properties map and surface topography map of the surface of the object based on the stored height parameter and the film parameters;
   determining a corrective factor;
   applying the corrective factor to the film properties map to produce an adjusted film properties map;
   subtracting the adjusted film properties map from the surface topography map to produce a corrected topography map; and
   storing the corrected topography map as the local topography of the surface of the object.

10. An apparatus for determining properties of a surface of an object, the apparatus comprising:
    a radiation source for producing radiation to be incident on the surface;

a detector for detecting the radiation after the radiation interacts with the surface and producing a measurement signal; and a computer with memory coupled to receive the measurement signal from the detector and a computer-usable medium having computer-readable program code embodied therein for causing said computer to:

process the measurement signal to remove a height contribution from the measurement signal leaving a film contribution in the measurement signal to produce a film measurement signal;

compare the film measurement signal to a plurality of film signals in a library stored in the memory to determine film parameters of the surface of the object, the library comprising the plurality of film signals and a plurality of full signals, wherein the plurality of film signals are associated with the plurality of full signals and the plurality of film signals are produced by removing height contributions from the plurality of full signals;

generate a reduced set of full signals using the film parameters of the surface, the reduced set of full signals having fewer signals than the plurality of film signals;

compare the measurement signal to the reduced set of full signals to determine a height parameter of the surface of the object; and store the height parameter and the film parameters in the memory.

11. The apparatus of claim 10, wherein the detector comprises a two-dimensional sensor optically aligned with the surface and having a plurality of pixels each corresponding to a respective location on the surface of the object, wherein each pixel produces the measurement signal, wherein the computer-readable program code causes the computer to process the measurement signal for each pixel to produce the film measurement signal for each pixel; compare the film measurement signal for each pixel to the plurality of film signals, generate the reduced set of full signals for each pixel, compare the measurement signal for each signal to the reduced set of full signals to determine a height parameter for the pixel, and store the height parameter and the film parameters for each pixel.

12. The apparatus of claim 10, wherein the computer-readable program code causes the computer to apply principal component analysis (PCA) reduction to the film measurement signal, wherein each film signal in the plurality of film signals in the library are PCA reduced.

13. The apparatus of claim 10, wherein the computer-readable program code causes the computer to process the measurement signal by squaring the measurement signal in frequency domain.

14. The apparatus of claim 10, wherein the computer-readable program code causes the computer to perform signal repair to the measurement signal prior to processing to produce the film measurement signal.

15. The apparatus of claim 14, wherein the computer-readable program code causes the computer to perform signal repair by causing the computer to:

convert the measurement signal to time domain;

generate a multiple derivative of the measurement signal in time domain;

convert a resulting derivative of the measurement signal to frequency domain as the measurement signal.

16. The apparatus of claim 10, wherein the apparatus is a white light interferometer.

17. The apparatus of claim 10, wherein the apparatus is an confocal microscope.

* * * * *